US008767490B2

(12) United States Patent
Jang

(10) Patent No.: US 8,767,490 B2
(45) Date of Patent: Jul. 1, 2014

(54) ELECTRICAL FUSE RUPTURE CIRCUIT

(75) Inventor: Nam Kyu Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 109 days.

(21) Appl. No.: 13/602,274

(22) Filed: Sep. 3, 2012

(65) Prior Publication Data

US 2013/0294183 A1  Nov. 7, 2013

(30) Foreign Application Priority Data

May 4, 2012  (KR) ........................ 10-2012-0047466

(51) Int. Cl.
| G11C 7/00 | (2006.01) |
| G11C 29/48 | (2006.01) |
| G11C 29/44 | (2006.01) |
| G11C 29/04 | (2006.01) |
| G11C 29/02 | (2006.01) |

(52) U.S. Cl.
CPC ............... *G11C 29/48* (2013.01); *G11C 29/44* (2013.01); *G11C 29/4401* (2013.01); *G11C 29/04* (2013.01); *G11C 29/027* (2013.01)
USPC .... 365/200; 365/201; 365/225.7; 365/189.07

(58) Field of Classification Search
CPC .... G11C 29/48; G11C 29/44; G11C 29/4401; G11C 29/04; G11C 29/027
USPC ..................................... 365/200, 201, 189.07
See application file for complete search history.

(56) References Cited

U.S. PATENT DOCUMENTS

| 5,959,909 | A | * | 9/1999 | Peng et al. ..................... 365/200 |
| 6,240,033 | B1 | | 5/2001 | Yang |
| 6,404,680 | B1 | * | 6/2002 | Kwon .......................... 365/185.3 |
| 6,417,704 | B1 | | 7/2002 | Nakajima |
| 6,480,428 | B2 | * | 11/2002 | Zheng et al. .................. 365/200 |
| 7,020,034 | B2 | * | 3/2006 | Chen ............................. 365/200 |
| 7,313,038 | B2 | * | 12/2007 | Otsuka ......................... 365/201 |
| 7,330,384 | B2 | * | 2/2008 | Min et al. ..................... 365/201 |
| 7,895,482 | B2 | * | 2/2011 | Fischer et al. ................ 714/710 |
| 8,015,457 | B2 | * | 9/2011 | Koshikawa et al. .......... 714/710 |
| 8,189,388 | B2 | * | 5/2012 | Jang ........................... 365/185.09 |
| 2007/0104000 | A1 | * | 5/2007 | Lin et al. ....................... 365/200 |
| 2009/0154244 | A1 | * | 6/2009 | Shiga ........................ 365/185.11 |
| 2012/0213022 | A1 | * | 8/2012 | Yang et al. .................... 365/201 |
| 2014/0006902 | A1 | * | 1/2014 | YANG et al. ................. 714/768 |

\* cited by examiner

*Primary Examiner* — Viet Q Nguyen
(74) *Attorney, Agent, or Firm* — William Park & Associates Patent Ltd.

(57) ABSTRACT

A semiconductor memory device including circuitry for detecting and repairing memory cell failures in a test mode. The memory cell repair process is conducted in a manner that effectively eliminates unnecessary fuse rupture operations and verify operations in a test mode, thus reducing product test time.

15 Claims, 5 Drawing Sheets

ELECTRICAL FUSE RUPTURE CIRCUIT

CROSS-REFERENCE TO RELATED APPLICATION

The present application claims priority under 35 U.S.C. §119(a) to Korean application number 10-2012-0047466, filed on May 4, 2012, in the Korean Intellectual Property Office, which is incorporated herein by reference in its entirety.

BACKGROUND

1. Technical Field

The present invention relates generally to a semiconductor integrated circuit, and in particular to an electrical fuse rupture circuit of a semiconductor memory apparatus.

2. Related Art

In general, as the degree of integration of a semiconductor memory apparatus sharply increases, tens of millions of memory cells are disposed in one semiconductor memory apparatus. If a failure occurs in even one of these memory cells, the semiconductor memory apparatus cannot perform a desired operation. As a process technology of a semiconductor memory apparatus is developed, failures statistically occur in only a small number of memory cells. When considering manufacturing yield, it is inefficient to discard semiconductor memory devices as bad products due to failures that occur in only a small number of memory cells. In order to cope with this problem, a semiconductor memory apparatus generally has redundant memory cells in addition to normal memory cells. If a failure occurs in a normal memory cell, the failed normal memory cell is replaced with a redundant memory cell. Hereafter, a normal memory cell among the normal memory cells of the device, which should be replaced with a redundant memory cell due to a failure, will be referred to as a 'memory cell to repair'.

Address information corresponding to the memory cell to repair is provided from a redundancy circuit. The redundancy circuit has a plurality of fuses for programming the address information of the memory cell to repair. Consequently, the redundancy circuit generates address information which is programmed to the fuses; that is, a repair information signal. The semiconductor memory apparatus compares the repair information signal with the address information applied in a read or write operation. When access to the memory cell to repair is attempted, an operation is performed such that access is made to a redundant memory cell instead of the memory cell to repair.

Programming the plurality of fuses provided in the redundancy circuit generally accomplished either by an electrical cutting method or a laser cutting method. The electrical cutting method is a method in which cutting accomplished by applying overcurrent to target fuses, while the laser cutting method is a method in which target fuses requiring cutting are blown using a laser beam. However, the physical fuse programming method using a laser can be performed only at a wafer level, before the semiconductor memory apparatus is manufactured as a package. Consequently, in order to replace a failed memory cell in a packaged state, the electrical cutting method is generally employed rather than the laser cutting method. In other words, in the package state, programming may be performed through changing the connection states of fuses by using the electrical cutting method.

Generally, the electrical cutting method employed in a test of a package is a bit defect (failure) relief technology. In the electrical cutting method employed in the test of the package, it is first determined in which memory cell a bit failure has occurred, overcurrent is applied to the memory cell in which the bit failure has occurred in order to cut the memory cell, and the failed memory cell is replaced with a redundant memory cell to allow current flow.

The operation of cutting the memory cell in which the bit failure has occurred is referred to as an electrical fuse rupture operation. In the conventional art, the electrical fuse rupture operation is performed by applying a specified command from an external controller a predetermined number of times, in order to initiate the electrical fuse rupture operation. After performing the electrical fuse rupture operation the predetermined number of times, it is then determined whether the electrical fuse rupture operation has been properly performed. If an evaluation indicates that the electrical fuse rupture operation has not been properly performed, the electrical fuse rupture operation is initiated once again.

In the case where the external command is repeatedly applied and the result of the electrical fuse rupture operation is repeatedly evaluated, an extended time for package testing results.

SUMMARY

In one embodiment in accordance with the present invention, an electrical fuse rupture circuit comprises a fuse rupture control block configured to receive failure address signals of each memory cell, perform a fuse rupture operation in response to a test mode signal and a reset signal, and output rupture address signals for each memory cell for which the fuse rupture operation is properly performed; and a rupture verification determination block configured to compare the failure address signals of each memory cell and the rupture address signals of each memory cell, determine whether the fuse rupture operation is properly performed, and generate a reset signal such that logic level is changed when the fuse rupture operation has succeeded, and is unchanged when the fuse rupture operation has failed.

In another embodiment in accordance with the present invention, an electrical fuse rupture circuit comprises a driving unit configured to generate an oscillation signal for performing a fuse rupture operation, in response to a test mode signal and a reset signal; a fuse rupture block configured to receive a plurality of failure address signals, perform the fuse rupture operation in response to the oscillation signal, and output a plurality of rupture address signals for verifying the fuse rupture operation for each memory cell; and a rupture verification determination block configured to execute a logic operation for each of the plurality of failure address signals and each of the plurality of rupture address signals, and determine whether to enable the reset signal, according to an operation result.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, embodiments of the present invention will be explained in more detail with reference to the accompanying drawings. Although the present invention is described with reference to example embodiments thereof, it should be understood that numerous other variations and modifications can be devised by those skilled in the art that will fall within the spirit and scope of the invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
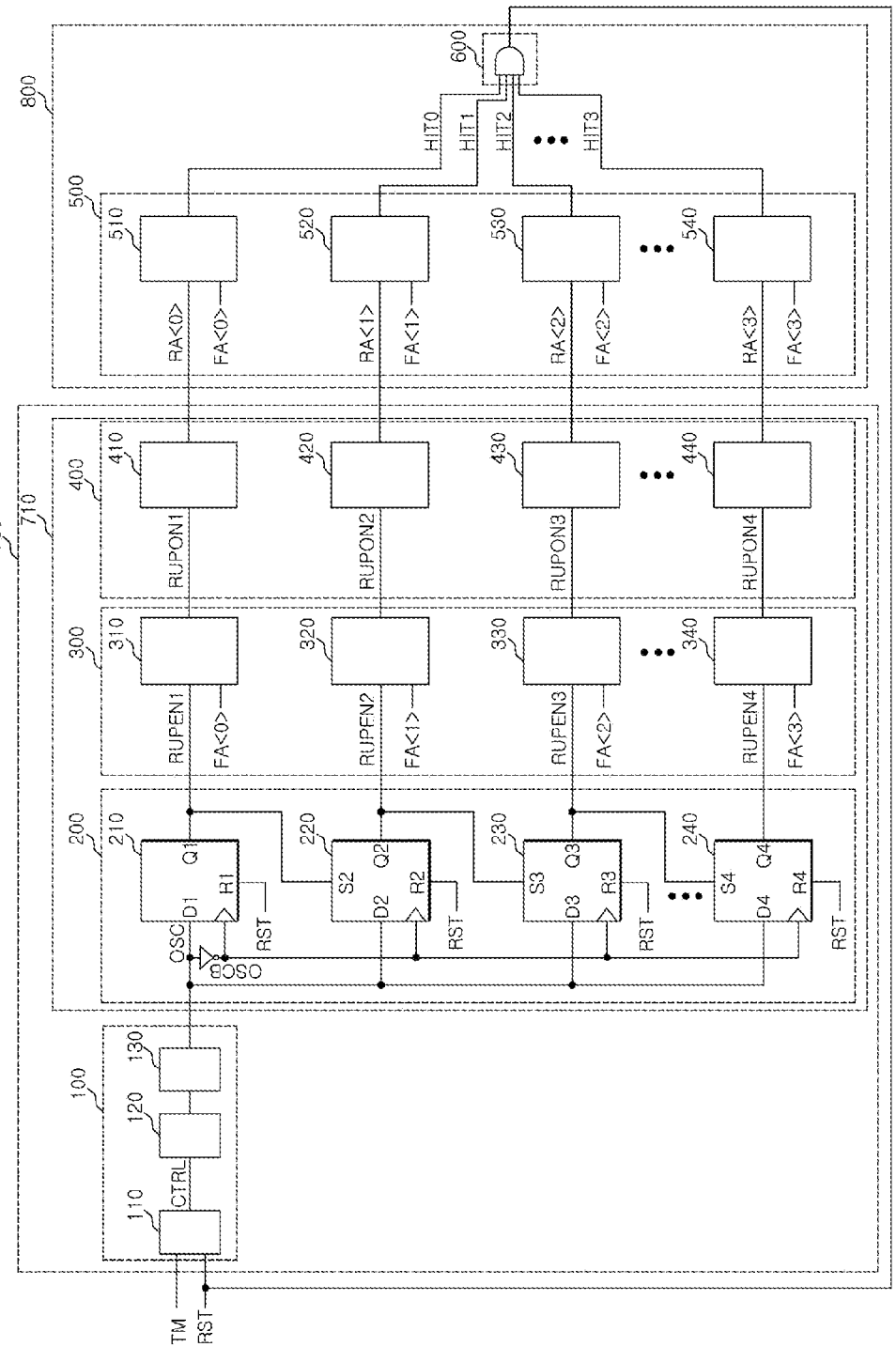
FIG. 1 is a block diagram of an electrical fuse rupture circuit in accordance with an embodiment of the present invention.

FIG. 1 illustrates that the electrical fuse rupture circuit in accordance with an embodiment of the present invention includes a rupture control block 700 and a rupture verification determination block 800. The rupture control block 700 includes a driving unit 100 and a fuse rupture block 710. The fuse rupture block 710 includes a rupture enable signal generation unit 200, a rupture signal generation unit 300, and a rupture unit 400. The rupture verification determination block 800 includes a rupture verification unit 500 and a reset signal generation unit 600.

The driving unit 100 includes a control section 110, a switch section 120 and an oscillator 130. The rupture enable signal generation unit 200 includes a plurality of flip-flops. The rupture enable signal generation unit 200 includes a first flip-flop 210, a second flip-flop 220, a third flip-flop 230 and a fourth flip-flop 240. The rupture signal generation unit 300 includes a plurality of failure address comparing sections. In an embodiment in accordance with the present invention, the rupture signal generation unit 300 includes a first failure address comparing section 310, a second failure address comparing section 320, a third failure address comparing section 330, and a fourth failure address comparing section 340. The rupture unit 400 includes a plurality of fuse rupture circuits, including a first fuse rupture circuit 410, a second fuse rupture circuit 420, a third fuse rupture circuit 430, and a fourth fuse rupture circuit 440.

The rupture verification unit 500 includes a plurality of rupture address comparing sections, including a first rupture address comparing section 510, a second rupture address comparing section 520, a third rupture address comparing section 530, and a fourth rupture address comparing section 540.

The rupture control block 700 receives failure address signals FA<0:3> of each memory cell and performs a fuse rupture operation in response to a test mode signal TM and a reset signal RST. The rupture control block 700 performs the fuse rupture operation and outputs rupture address signals RA<0:3> for each memory cell for which the fuse rupture operation is verified.

The rupture verification determination block 800 is configured to compare the failure address signals FA<0:3> of each memory cell and the rupture address signals RA<0:3> of each memory cell and generate the reset signal RST.

The driving unit 100 generates an oscillation signal OSC in response to the test mode signal TM and the reset signal RST. The control section 110 is configured to generate a control signal CTRL in response to the test mode signal TM and the reset signal RST. The switch section 120 controls output of the oscillation signal OSC from the oscillator 130 in response to the control signal CTRL. The driving unit 100 enables the oscillator 130 and outputs the oscillation signal OSC when the test mode signal TM is enabled, and disables the oscillator 130 and cuts off the output of the oscillation signal OSC when the reset signal RST is enabled.

The fuse rupture block 710 receives the failure address signals FA<0:3> of each memory cell and performs the fuse rupture operation in response to the oscillation signal OSC. The fuse rupture block 710 performs the fuse rupture operation and outputs the rupture address signals RA<0:3> of each memory cell for which the fuse rupture operation is verified.

The rupture enable signal generation unit 200 is configured to generate a plurality of rupture enable signals RUPEN1:4 in response to the oscillation signal OSC. A complementary oscillation signal OSCB is a signal which is generated by inverting the oscillation signal OSC. The first flip-flop 210 receives the oscillation signal OSC through an input terminal D1, and outputs the first rupture enable signal RUPEN1 through an output terminal Q1 in response to the complementary oscillation signal OSCB. The second flip-flop 220 receives the oscillation signal OSC through an input terminal D2, receives the first rupture enable signal RUPEN1 through a set terminal S2, and outputs the second rupture enable signal RUPEN2 through an output terminal Q2 in response to the complementary oscillation signal OSCB. The third flip-flop 230 receives the oscillation signal OSC through an input terminal D3, receives the second rupture enable signal RUPEN2 through a set terminal S3, and outputs the third rupture enable signal RUPEN3 through an output terminal Q3 in response to the complementary oscillation signal OSCB. The fourth flip-flop 240 receives the oscillation signal OSC through an input terminal D4, receives the third rupture enable signal RUPEN3 through a set terminal S4, and outputs the fourth rupture enable signal RUPEN4 through an output terminal Q4 in response to the complementary oscillation signal OSCB. The first to fourth flip-flops 210 to 240 may include reset terminals R1, R2, R3 and R4 for receiving the reset signal RST.

The rupture signal generation unit 300 generates a plurality of rupture signals RUPON1:4 in response to the plurality of rupture enable signals RUPEN1:4 and the plurality of failure address signals FA<0:3>. The failure address signals FA are the address signals of a memory cell in which a bit failure has occurred. The failure address signals are enabled when a bit failure occurs in a memory cell. The rupture signal generation unit 300 compares the plurality of failure address signals FA<0:3> and the plurality of rupture enable signals RUPEN1:4 and generates the plurality of rupture signals RUPON1:4 so that the fuse rupture operation can be performed for a corresponding address of a memory cell in which a bit failure has occurred.

The rupture unit 400 outputs the plurality of rupture address signals RA<0:3> in response to the plurality of rupture signals RUPON1:4. The rupture unit 400 receives the plurality of rupture signals RUPON1:4, applies a high voltage to the gate and the source (or the drain) of the memory cell in which a bit failure occurred, ruptures a gate oxide, and causes the corresponding memory cell to lose the property of a semiconductor as a transistor, so that the corresponding memory cell, when deprived of this property of a semiconductor, is replaced with a redundant memory cell to allow current flow through the redundant memory cell.

The operation of applying the high voltage to the gate and the source (or the drain) of the memory cell in which the bit failure occurred, and rupturing the gate oxide, is called a fuse rupture operation. The respective fuse rupture circuits 410, 420, 430 and 440 perform the fuse rupture operation in response to the respective rupture signals RUPON1:4. The rupture unit 400 outputs rupture address signals RA from the respective fuse rupture circuits 410, 420, 430 and 440 when the fuse rupture operation is completed. The rupture address signals RA are signals indicating whether the fuse rupture operation has been performed. That is to say, the rupture unit 400 outputs the rupture address signals RA indicating that the fuse rupture operation has been performed, for a memory cell in which a bit failure occurred, and outputs the rupture address signals RA indicating that the fuse rupture operation has not been performed, for a memory cell in which a bit failure did not occur.

The rupture verification unit 500 is configured to compare the plurality of rupture address signals RA<0:3> and the plurality of is failure address signals FA<0:3>, and verify whether the fuse rupture operation has been performed for a memory cell in which a bit failure has occurred. The rupture verification unit 500 compares the respective rupture address signals RA<0:3> and the respective failure address signals FA<0:3> and outputs a plurality of verification signals HIT0:3.

The reset signal generation unit 600 outputs the reset signal RST in response to the plurality of verification signals HIT0:3. The reset signal generation unit 600 executes a logic operation of the plurality of verification signals HIT0:3 and outputs the reset signal RST. The reset signal generation unit 600 enables the reset signal RST when the fuse rupture operation is properly performed, and disables the reset signal RST when the fuse rupture operation is not properly performed.

The driving unit 100 cuts off the output of the oscillation signal OSC when the reset signal RST is enabled, as the fuse rupture operation is properly performed. However, the driving unit 100 continues to output the oscillation signal OSC when the reset signal RST is disabled, as the fuse rupture operation is not properly performed. The electrical fuse rupture circuit verifies whether the fuse rupture operation is properly performed, and performs the fuse rupture operation until the fuse rupture operation is properly performed.

Figure 2:
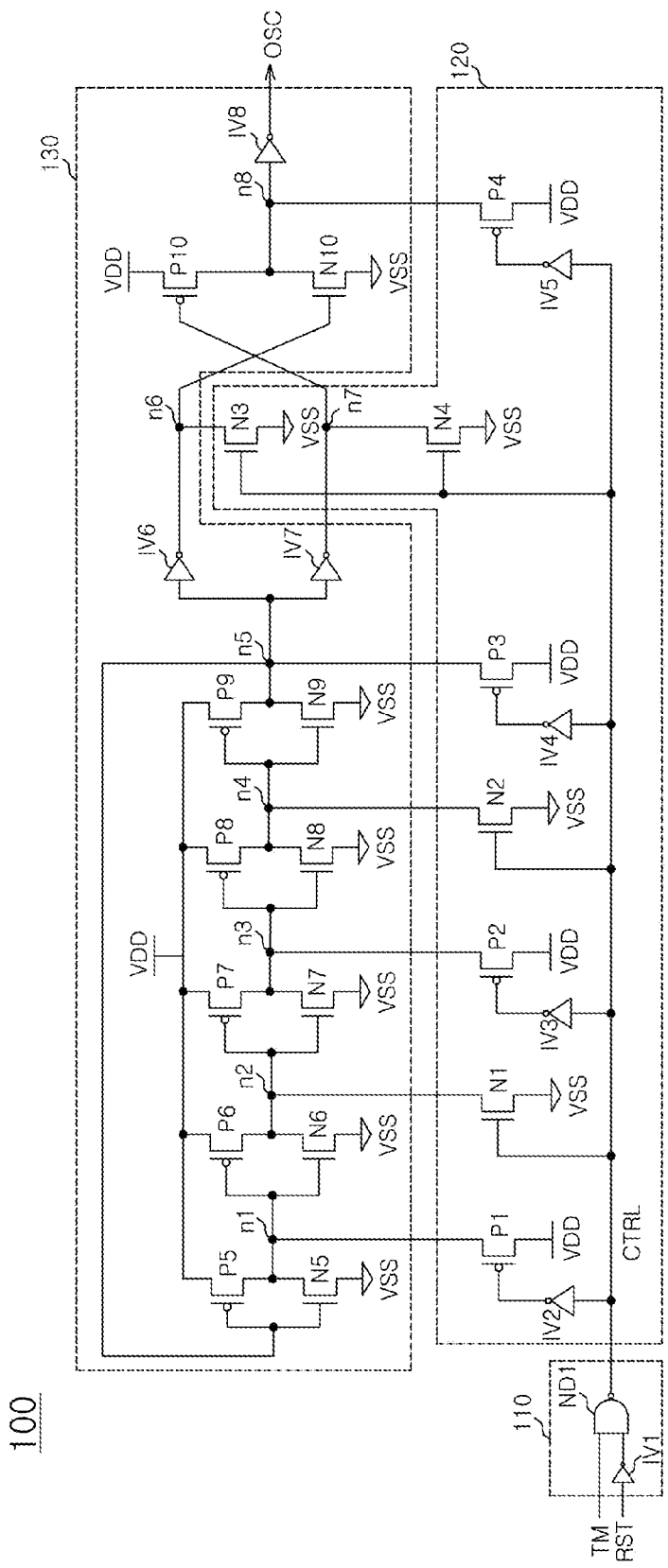
FIG. 2 is a schematic diagram of the driving unit 100 depicted in FIG. 1.

FIG. 2 illustrates that the driving unit 100, in accordance with an embodiment of the present invention, includes the control section 110, the switch section 120 and the oscillator 130. The control section 110 includes a first inverter IV1 which inverts the reset signal RST, and a first NAND gate ND1 which performs a logic operation for the output signal of the first inverter IV1 and the test mode signal TM and outputs the control signal CTRL.

The switch section 120 includes a second inverter IV2 which inverts the control signal CTRL, a third inverter IV3 which inverts the control signal CTRL, a fourth inverter IV4 which inverts the control signal CTRL, a fifth inverter IV5 which inverts the control signal CTRL, a first PMOS transistor P1 which is connected between a first node n1 and a driving voltage VDD and receives the output signal of the second inverter IV2, a first NMOS transistor N1 which is connected between a second node n2 and a ground voltage VSS and receives the control signal CTRL, a second PMOS transistor P2 which is connected between a third node n3 and the driving voltage VDD and receives the output signal of the third inverter IV3 through the gate thereof, a second NMOS transistor N2 which is connected between a fourth node n4 and the ground voltage VSS and receives the control signal CTRL, a third PMOS transistor P3 which is connected between a fifth node n5 and the driving voltage VDD and receives the output signal of the fourth inverter IV4, a third NMOS transistor N3 which is connected between a sixth node n6 and the ground voltage VSS and receives the control signal CTRL, a fourth NMOS transistor N4 which is connected between a seventh node n7 and the ground voltage VSS and receives the control signal CTRL, and a fourth PMOS transistor P4 which is connected between an eighth node n8 and the driving voltage VDD and receives the output signal of the fifth inverter IV5.

The oscillator 130 includes a fifth PMOS transistor P5 which is connected between the first node n1 and the driving voltage VDD and receives the output signal of the fifth node n5, a fifth NMOS transistor N5 which is connected between the first node n1 and the ground voltage VSS and receives the output signal of the fifth node n5, a sixth PMOS transistor P6 which is connected between the second node n2 and the driving voltage VDD and receives the output signal of the first node n1, a sixth NMOS transistor N6 which is connected between the second node n2 and the ground voltage VSS and receives the output signal of the first node n1, a seventh PMOS transistor P7 which is connected between the third node n3 and the driving voltage VDD and receives the output signal of the second node n2, and a seventh NMOS transistor N7 which is connected between the third node n3 and the ground voltage VSS and receives the output signal of the second node n2.

The oscillator 130 also includes an eighth PMOS transistor P8 which is connected between the fourth node n4 and the driving voltage VDD and receives the output signal of the third node n3, an eighth NMOS transistor N8 which is connected between the fourth node n4 and the ground voltage VSS and receives the output signal of the third node n3, a ninth PMOS transistor P9 which is connected between the fifth node n5 and the driving voltage VDD and receives the output signal of the fourth node n4, a ninth NMOS transistor N9 which is connected between the fifth node n5 and the ground voltage VSS and receives the output signal of the fourth node n4, a sixth inverter IV6 which inverts the output signal of the fifth node n5 and outputs a resultant signal to the sixth node n6, a seventh inverter IV7 which inverts the output signal of the fifth node n5 and outputs a resultant signal to the seventh node n7, a tenth NMOS transistor N10 which is connected between the eighth node n8 and the ground voltage VSS and receives the output signal of the sixth node n6, a tenth PMOS transistor P10 which is connected between the eighth node n8 and the driving voltage VDD and receives the output signal of the seventh node n7, and an eighth inverter IV8 which inverts the output signal of the eighth node n8 and outputs the oscillation signal OSC.

The control section 110 outputs the control signal CTRL with a low level when the input value of the test mode signal TM is a high level and the input value of the reset signal RST is a low level. Since the second to fifth inverters IV2 to IV5 of the switch section 120 invert the control signal CTRL and output resultant signals, the second to fifth inverters IV2 to IV5 invert the control signal CTRL and output signals with high levels. The first to fourth PMOS transistors P1 to P4, which receive the output signals of the second to fifth inverters IV2 to IV5 with the high levels, are turned off. The first to fourth NMOS transistors N1 to N4 which receive the control signal CTRL with the low level are turned off.

Since the first to fourth PMOS transistors P1 to P4 and the first to fourth NMOS transistors N1 to N4 are connected with the first to eighth nodes n1 to n8 of the oscillator 130, if the first to fourth PMOS transistors P1 to P4 and the first to fourth NMOS transistors N1 to N4 are turned off, the first to eighth nodes n1 to n8 of the oscillator 130 cannot be pulled up or pulled down. When the control signal CTRL with the low level is inputted, the switch section 120 causes the oscillator 130 to output the oscillation signal OSC. In other words, the driving unit 100 outputs the oscillation signal OSC with a predetermined cycle when the fuse rupture operation is not completed.

The control section 110 outputs the control signal CTRL with a high level when the reset signal RST is inputted at a high level. Since the second to fifth inverters IV2 to IV5 of the switch section 120 invert the control signal CTRL and output resultant signals, the second to fifth inverters IV2 to IV5 invert the control signal CTRL and output signals with low levels. The first to fourth PMOS transistors P1 to P4, which receive the output signals of the second to fifth inverters IV2 to IV5 with the low levels, are turned on. The first to fourth NMOS transistors N1 to N4 which receive the control signal CTRL with the high level are turned on. Since the first to fourth PMOS transistors P1 to P4 and the first to fourth NMOS transistors N1 to N4 are connected with the first to eighth nodes n1 to n8 of the oscillator 130, if the first to fourth PMOS transistors P1 to P4 and the first to fourth NMOS transistors N1 to N4 are turned on, the first to eighth nodes n1 to n8 of the oscillator 130 can be pulled up or pulled down. Namely, the driving unit 100 cuts off the output of the oscillation signal OSC when the fuse rupture operation is completed.

In accordance with an embodiment of the present invention, the control section 110 disables the control signal CTRL when the test mode signal TM is enabled and the reset signal RST is disabled. The switch section 120 receives the control signal CTRL, which is disabled, and interrupts the operation of cutting off the output of the oscillation signal OSC from the oscillator 130. At this time, the oscillator 130 outputs the oscillation signal OSC. That is to say, the driving unit 100 outputs the oscillation signal OSC when the reset signal RST is disabled.

The control section 110 enables the control signal CTRL when the reset signal RST is enabled. The switch section 120 receives the control signal CTRL, which is enabled, and performs the operation of cutting off the output of the oscillation signal OSC from the oscillator 130.

The rupture enable signal generation unit 200 receives the oscillation signal OSC, which is outputted from the driving unit 100, and generates the plurality of rupture enable signals RUPEN1:4. The rupture enable signal generation unit 200 receives the oscillation signal OSC and generates the plurality of rupture enable signals RUPEN1:4 which have pulses of a predetermined logic level.

In an embodiment in accordance with the present invention, the predetermined logic level of the plurality of rupture enable signals RUPEN1:4 is a high level. The rupture enable signal generation unit 200, which generates the plurality of rupture enable signals RUPEN1:4, includes the plurality of flip-flops 210 to 240 which receive the oscillation signal OSC and generate the pulses.

The rupture signal generation unit 300 compares the plurality of rupture enable signals RUPEN1:4 with the pulses of the predetermined logic level, and the first to fourth failure address signals FA<0:3>, and generates the plurality of rupture signals RUPON1:4. The first failure address comparing section 310 compares the first rupture enable signal RUPEN1 and the first failure address signal FA<0> and generates the first rupture signal RUPON1 when the two signals are in enabled states. The second failure address comparing section 320 compares the second rupture enable signal RUPEN2 and the second failure address signal FA<1> and generates the second rupture signal RUPON2 when the two signals are in enabled states. The third failure address comparing section 330 compares the third rupture enable signal RUPEN3 and the third failure address signal FA<2> and generates the third rupture signal RUPON3 when the two signals are in enabled states. The fourth failure address comparing section 340 compares the fourth rupture enable signal RUPEN4 and the fourth failure address signal FA<3> and generates the fourth rupture signal RUPON4 when the two signals are in enabled states.

Figure 3:
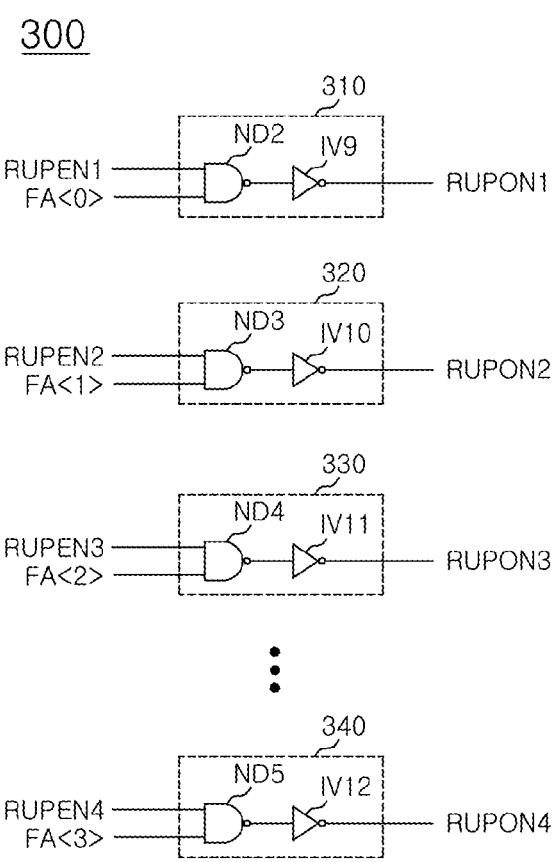
FIG. 3 is a schematic diagram of the rupture signal generation unit 300 shown in FIG. 1.

The rupture signal generation unit 300 includes the plurality of failure address comparing sections 310 to 340, as shown in FIG. 3. The first failure address comparing section 310 includes a second NAND gate ND2 which executes a logic operation for the first rupture enable signal RUPEN1 and the first failure address signal FA<0>, and a ninth inverter IV9 which inverts the output signal of the second NAND gate ND2 and outputs the first rupture signal RUPON1. The second failure address comparing section 320 includes a third NAND gate ND3 which executes a logic operation for the second rupture enable signal RUPEN2 and the second failure address signal FA<1>, and a tenth inverter IV10 which inverts the output signal of the third NAND gate ND3 and outputs the second rupture signal RUPON2.

The third failure address comparing section 330 includes a fourth NAND gate ND4 which executes a logic operation for the third rupture enable signal RUPEN3 and the third failure address signal FA<2>, and an eleventh inverter IV11 which inverts the output signal of the fourth NAND gate ND4 and outputs the third rupture signal RUPON3. The fourth failure address comparing section 340 includes a fifth NAND gate ND5 which executes a logic operation for the fourth rupture enable signal RUPEN4 and the fourth failure address signal FA<3>, and a twelfth inverter IV12 which inverts the output signal of the fifth NAND gate ND5 and outputs the fourth rupture signal RUPON4.

The rupture signal generation unit 300 compares the plurality of rupture enable signals RUPEN1:4 with high levels and the plurality of failure address signals FA<0:3> with high levels, and generates the plurality of rupture signals RUPON1:4 with high levels. The failure address signals FA have a high level when a bit failure occurs in a memory cell and a low level when a bit failure does not occur in the memory cell. In other words, the rupture signal generation unit 300 compares the rupture enable signals RUPEN and the failure address signals FA which have a high level as a bit failure occurs in a memory cell, and generates the rupture signals RUPON so that the fuse rupture operation can be performed.

The first failure address comparing section 310 compares the first rupture enable signal RUPEN1 having the high level and the first failure address signal FA<0> having the high level, due to the occurrence of a bit failure in the corresponding memory cell, and outputs the first rupture signal RUPON1 with the high level when both signals have high levels. The second failure address comparing section 320 compares the second rupture enable signal RUPEN2 having the high level and the second failure address signal FA<1> having the high level, due to the occurrence of a bit failure in the corresponding memory cell, and outputs the second rupture signal RUPON2 with the high level when both signals have high levels.

The third failure address comparing section 330 compares the third rupture enable signal RUPEN3 having the high level and the third failure address signal FA<2> having the high level, due to the occurrence of a bit failure in the corresponding memory cell, and outputs the third rupture signal RUPON3 with the high level when both signals have high levels. The fourth failure address comparing section 340 compares the fourth rupture enable signal RUPEN4 having the high level and the fourth failure address signal FA<3> having the high level, due to the occurrence of a bit failure in the corresponding memory cell, and outputs the fourth rupture signal RUPON4 with the high level when both signals have high levels.

Referring to FIG. 1, the rupture unit 400 includes the plurality of fuse rupture circuits 410 to 440. The rupture unit 400 performs the fuse rupture operation by applying an electrical stress to fuses when the plurality of rupture signals RUPON1:4 are inputted in enabled states. The rupture unit 400 outputs rupture address signals in enabled states when the fuse rupture operation is performed and outputs rupture address signals in disabled states when the fuse rupture operation is not performed. The first rupture circuit 410 is configured to perform the fuse rupture operation and enable the first rupture address signal RA<0> when the first rupture signal RUPON1 is enabled, and not perform the fuse rupture operation, and disable the first rupture address signal RA<0>, when the first rupture signal RUPON1 is disabled. The second rupture circuit 420 is configured to perform the fuse rupture operation and enable the second rupture address signal RA<1>, when the second rupture signal RUPON2 is enabled, and not perform the fuse rupture operation and disable the second rupture address signal RA<1> when the second rupture signal RUPON2 is disabled.

The third rupture circuit 430 is configured to perform the fuse rupture operation and enable the third rupture address signal RA<2> when the third rupture signal RUPON3 is enabled, and not perform the fuse rupture operation and disable the third rupture address signal RA<2>, when the third rupture signal RUPON3 is disabled. The fourth rupture circuit 440 is configured to perform the fuse rupture operation and enable the fourth rupture address signal RA<3>, when the fourth rupture signal RUPON4 is enabled, and not perform the fuse rupture operation and disable the fourth rupture address signal RA<3> when the fourth rupture signal RUPON4 is disabled.

In an embodiment in accordance with the present invention, the rupture unit 400 performs the fuse rupture operation by applying an electrical stress to fuses when the plurality of rupture signals RUPON1:4 are inputted at the high levels. The rupture unit 400 outputs the rupture address signals with high levels when the fuse rupture operation is performed, and outputs the rupture address signals with low levels when the fuse rupture operation is not performed. The first rupture circuit 410 performs the fuse rupture operation and outputs the first rupture address signal RA<0> with the high level when the first rupture signal RUPON1 with the high level is inputted, and does not perform the fuse rupture operation, and outputs the first rupture address signal RA<0> with the low level, when the first rupture signal RUPON1 with the low level is inputted. The second rupture circuit 420 performs the fuse rupture operation and outputs the second rupture address signal RA<1> with the high level when the second rupture signal RUPON2 with the high level is inputted, and does not perform the fuse rupture operation and outputs the second rupture address signal RA<1> with the low level, when the second rupture signal RUPON2 with the low level is inputted.

The third rupture circuit 430 performs the fuse rupture operation and outputs the third rupture address signal RA<2> with the high level when the third rupture signal RUPON3 with the high level is inputted, and does not perform the fuse rupture operation and outputs the third rupture address signal RA<2> with the low level, when the third rupture signal RUPON3 with the low level is inputted. The fourth rupture circuit 440 performs the fuse rupture operation and outputs the fourth rupture address signal RA<3> with the high level, when the fourth rupture signal RUPON4 with the high level is inputted, and does not perform the fuse rupture operation and outputs the fourth rupture address signal RA<3> with the low level, when the fourth rupture signal RUPON4 with the low level is inputted.

Figure 4:
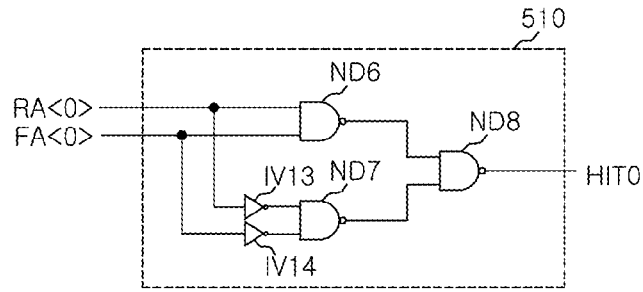
FIG. 4 is a schematic diagram of the rupture verification unit 500 of FIG. 1.
Figure 4:
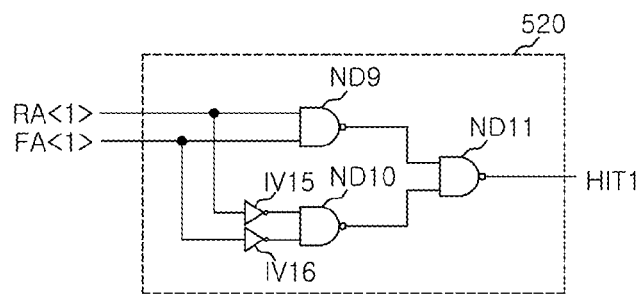
Figure 4:
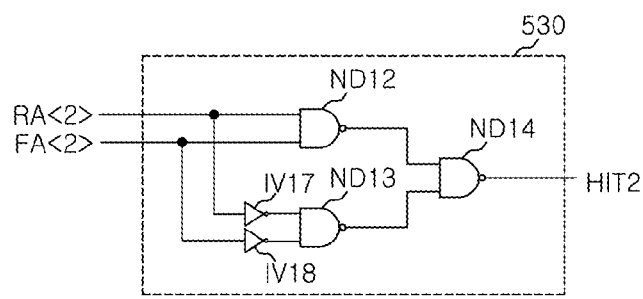
Figure 4:
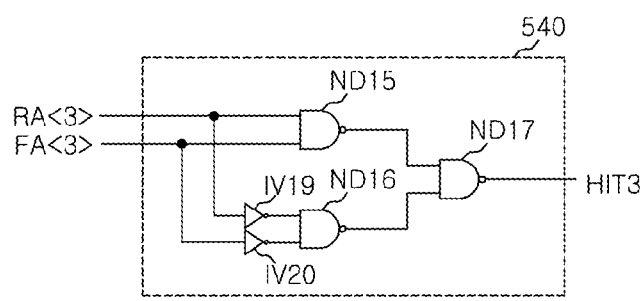

Referring now to FIGS. 1 and 4, the rupture verification unit 500 includes the plurality of rupture address comparing sections 510 to 540. The first rupture address comparing section 510 includes a thirteenth inverter IV13 which inverts the first rupture address signal RA<0>, a fourteenth inverter IV14 which inverts the first failure address signal FA<0>, a sixth NAND gate ND6 which executes a logic operation for the first rupture address signal RA<0> and the first failure address signal FA<0>, a seventh NAND gate ND7 which executes a logic operation for the output signal of the thirteenth inverter IV13 and the output signal of the fourteenth inverter IV14, and an eighth NAND gate ND8 which executes a logic operation for the output signal of the sixth NAND gate ND6 and the output signal of the seventh NAND gate ND7 and outputs the first verification signal HIT0. The second rupture address comparing section 520 includes a fifteenth inverter IV15 which inverts the second rupture address signal RA<1>, a sixteenth inverter IV16 which inverts the second failure address signal FA<1>, a ninth NAND gate ND9 which executes a logic operation for the second rupture address signal RA<1> and the second failure address signal FA<1>, a tenth NAND gate ND10 which executes a logic operation for the output signal of the fifteenth inverter IV15 and the output signal of the sixteenth inverter IV16, and an eleventh NAND gate ND11 which executes a logic operation for the output signal of the ninth NAND gate ND9 and the output signal of the tenth NAND gate ND10 and outputs the second verification signal HIT1.

The third rupture address comparing section 530 includes a seventeenth inverter IV17 which inverts the third rupture address signal RA<2>, an eighteenth inverter IV18 which inverts the third failure address signal FA<2>, a twelfth NAND gate ND12 which executes a logic operation for the third rupture address signal RA<2> and the third failure address signal FA<2>, a thirteenth NAND gate ND13 which executes a logic operation for the output signal of the seventeenth inverter IV17 and the output signal of the eighteenth inverter IV18, and a fourteenth NAND gate ND14 which executes a logic operation for the output signal of the twelfth NAND gate ND12 and the output signal of the thirteenth NAND gate ND13 and outputs the third verification signal HIT2. The fourth rupture address comparing section 540 includes a nineteenth inverter IV19 which inverts the fourth rupture address signal RA<3>, an twentieth inverter IV20 which inverts the fourth failure address signal FA<3>, a fifteenth NAND gate ND15 which executes a logic operation for the fourth rupture address signal RA<3> and the fourth failure address signal FA<3>, a sixteenth NAND gate ND16 which executes a logic operation for the output signal of the nineteenth inverter IV19 and the output signal of the twentieth inverter IV20, and a seventeenth NAND gate ND17 which executes a logic operation for the output signal of the fifteenth NAND gate ND15 and the output signal of the sixteenth NAND gate ND16 and outputs the fourth verification signal HIT3.

The rupture verification unit 500 compares the failure address signals FA, which indicate the address of the memory cell in which a bit failure occurred, and rupture address signals RA which indicate a result of performing the fuse rupture operation for the memory cell in which the bit failure occurred, and verifies whether the fuse rupture operation is properly performed. The first rupture address comparing section 510 compares the first rupture address signal RA<0> with the first failure address signal FA<0>, when the first rupture address signal RA<0> is inputted, and verifies whether the fuse rupture operation is properly performed.

For example, if the first failure address signal FA<0> is inputted to the rupture signal generation unit 300 in the enabled state indicating that a bit failure occurred, the rupture signal generation unit 300 enables the first rupture signal RUPON1. The first fuse rupture circuit 410 receives the enabled first rupture signal RUPON1 and performs the fuse rupture operation. When the first fuse rupture circuit 410 properly performs the fuse rupture operation, the first fuse rupture circuit 410 outputs the first rupture address signal RA<0> in the enabled state, and when the first fuse rupture circuit 410 does not properly perform the fuse rupture operation, the first fuse rupture circuit 410 outputs the first rupture address signal RA<0> in the disabled state.

Also, if the first failure address signal FA<0> is inputted to the rupture signal generation unit 300 in the disabled state indicating that a bit failure did not occur, the rupture signal generation unit 300 disables the first rupture signal RUPON1. The first fuse rupture circuit 410 receives the disabled first rupture signal RUPON1 and does not perform the fuse rupture operation, and outputs the first rupture address signal RA<0> in the disabled state.

In the case where a bit failure occurs, the first rupture address comparing section 510 compares the first failure address signal FA<0> and the first rupture address signal RA<0>. When these two signals are inputted in the enabled states, the first rupture address comparing section 510 enables the first verification signal HIT0 since the fuse rupture operation of the first fuse rupture circuit 410 was properly performed. However, when the first failure address signal FA<0> is enabled and the first rupture address signal RA<0> is disabled, the first rupture address comparing section 510 disables the first verification signal HIT0, since the fuse rupture operation of the first fuse rupture circuit 410 was not properly performed.

In the case where a bit failure did not occur, the first rupture address comparing section 510 compares the first failure address signal FA<0> and the first rupture address signal RA<0>. When these two signals are inputted in the disabled states, the first rupture address comparing section 510 enables the first verification signal HIT0, since it is not necessary to perform the fuse rupture operation.

In another example, if the second failure address signal FA<1> is inputted to the rupture signal generation unit 300 in the enabled state indicating that a bit failure occurred, the rupture signal generation unit 300 enables the second rupture signal RUPON2. The second fuse rupture circuit 420 receives the enabled second rupture signal RUPON2 and performs the fuse rupture operation. When the second fuse rupture circuit 420 properly performs the fuse rupture operation, the second fuse rupture circuit 420 outputs the second rupture address signal RA<1> in the enabled state, and when the second fuse rupture circuit 420 does not properly perform the fuse rupture operation, the second fuse rupture circuit 420 outputs the second rupture address signal RA<1> in the disabled state.

If the second failure address signal FA<1> is inputted to the rupture signal generation unit 300 in the disabled state indicating that a bit failure did not occur, the rupture signal generation unit 300 is disables the second rupture signal RUPON2. The second fuse rupture circuit 420 receives the disabled second rupture signal RUPON2 and does not perform the fuse rupture operation, and outputs the second rupture address signal RA<1> in the disabled state.

When a bit failure occurs, the second rupture address comparing section 520 compares the second failure address signal FA<1> and the second rupture address signal RA<1>. When these two signals are inputted in the enabled states, the second rupture address comparing section 520 enables the second verification signal HIT1, since the fuse rupture operation of the second fuse rupture circuit 420 was properly performed. However, when the second failure address signal FA<1> is enabled and the second rupture address signal RA<1> is disabled, the second rupture address comparing section 520 disables the second verification signal HIT1, since the fuse rupture operation of the second fuse rupture circuit 420 was not properly performed.

In the event that a bit failure did not occur, the second rupture address comparing section 520 compares the second failure address signal FA<1> and the second rupture address signal RA<1>. When these two signals are inputted in the disabled states, the second rupture address comparing section 520 enables the second verification signal HIT1, since it is not necessary to perform the fuse rupture operation.

Furthermore, if the third failure address signal FA<2> is inputted to the rupture signal generation unit 300 in the enabled state, indicating that a bit failure occurred, the rupture signal generation unit 300 enables the third rupture signal RUPON3. The third fuse rupture circuit 430 receives the enabled third rupture signal RUPON3 and performs the fuse rupture operation. When the third fuse rupture circuit 430 properly performs the fuse rupture operation, the third fuse rupture circuit 430 outputs the third rupture address signal RA<2> in the enabled state, and when the third fuse rupture circuit 430 does not properly perform the fuse rupture operation, the third fuse rupture circuit 430 outputs the third rupture address signal RA<2> in the disabled state.

If the third failure address signal FA<2> is inputted to the rupture signal generation unit 300 in the disabled state, indicating that a bit failure did not occur, the rupture signal generation unit 300 disables the third rupture signal RUPON3. The third fuse rupture circuit 430 receives the disabled third rupture signal RUPON3, and does not perform the fuse rupture operation, and outputs the third rupture address signal RA<2> in the disabled state.

In the case where a bit failure occurred, the third rupture address comparing section 530 compares the third failure address signal FA<2> and the third rupture address signal RA<2>. When these two signals are inputted in the enabled states, the third rupture address comparing section 530 enables the third verification signal HIT2, since the fuse rupture operation of the third fuse rupture circuit 430 was properly performed. However, when the third failure address signal FA<2> is enabled and the third rupture address signal RA<2> is disabled, the third rupture address comparing section 530 disables the third verification signal HIT2, since the fuse rupture operation of the third fuse rupture circuit 430 was not properly performed.

In the case where a bit failure did not occur, the third rupture address comparing section 530 compares the third failure address signal FA<2> and the third rupture address signal RA<2>. When these two signals are inputted in the disabled states, the third rupture address comparing section 530 enables the third verification signal HIT2, since it is not necessary to perform the fuse rupture operation.

If the fourth failure address signal FA<3> is inputted to the rupture signal generation unit 300 in the enabled state, indicating that a bit failure occurred, the rupture signal generation unit 300 enables the fourth rupture signal RUPON4. The fourth fuse rupture circuit 440 receives the enabled fourth rupture signal RUPON4 and performs the fuse rupture operation. When the fourth fuse rupture circuit 440 properly performs the fuse rupture operation, the fourth fuse rupture circuit 440 outputs the fourth rupture address signal RA<3> in the enabled state, and when the fourth fuse rupture circuit 440 does not properly perform the fuse rupture operation, the fourth fuse rupture circuit 440 outputs the fourth rupture address signal RA<3> in the disabled state.

If the fourth failure address signal FA<3> is inputted to the rupture signal generation unit 300 in the disabled state, indicating that a bit failure did not occur, the rupture signal generation unit 300 disables the fourth rupture signal RUPON4. The fourth fuse rupture circuit 440 receives the disabled fourth rupture signal RUPON4 and does not perform the fuse rupture operation, and outputs the fourth rupture address signal RA<3> in the disabled state.

In the case where a bit failure occurred, the fourth rupture address comparing section 540 compares the fourth failure address signal FA<3> and the fourth rupture address signal RA<3>. When these two signals are inputted in the enabled states, the fourth rupture address comparing section 540 enables the fourth verification signal HIT3, since the fuse rupture operation of the fourth fuse rupture circuit 440 was properly performed. However, when the fourth failure address signal FA<3> is enabled and the fourth rupture address signal RA<3> is disabled, the fourth rupture address comparing section 540 disables the fourth verification signal HIT3, since the fuse rupture operation of the fourth fuse rupture circuit 440 was not properly performed.

In the case where a bit failure did not occur, the fourth rupture address comparing section 540 compares the fourth failure address signal FA<3> and the fourth rupture address signal RA<3>. When these two signals are inputted in the disabled states, the fourth rupture address comparing section 540 enables the fourth verification signal HIT3, since it is not necessary to perform the fuse rupture operation.

That is to say, when both the plurality of failure address signals FA<0:3> and the plurality of rupture address signals RA<0:3> are in the enabled states or the disabled states, the rupture verification unit 500 determines that the fuse rupture operation was performed in accordance with the failure address signals FA<0:3>, and enables the plurality of verification signals HIT0:3.

In an embodiment in accordance with the present invention, if the first failure address signal FA<0> with the high level is inputted to the rupture signal generation unit 300, indicating that a bit failure occurred, the rupture signal generation unit 300 generates the first rupture signal RUPON1 with the high level. The first fuse rupture circuit 410 receives the first rupture signal RUPON1 with the high level and performs the fuse rupture operation. When the first fuse rupture circuit 410 properly performs the fuse rupture operation, the first fuse rupture circuit 410 outputs the first rupture address signal RA<0> with the high level, and when the first fuse rupture circuit 410 did not properly perform the fuse rupture operation, the first fuse rupture circuit 410 outputs the first rupture address signal RA<0> with the low level.

If the first failure address signal FA<0> with the low level is inputted to the rupture signal generation unit 300, indicating that a bit failure did not occur, the rupture signal generation unit 300 generates the first rupture signal RUPON1 with the low level. The first fuse rupture circuit 410 receives the first rupture signal RUPON1 with the low level, and does not perform the fuse rupture operation, and outputs the first rupture address signal RA<0> with the low level.

In the case where a bit failure occurred, when both the first failure address signal FA<0> and the first rupture address signal RA<0> are inputted at the high levels, the first rupture address comparing section 510 outputs the first verification signal HIT0 with the high level, since the fuse rupture operation of the first fuse rupture circuit 410 was properly performed. However, when the first failure address signal FA<0> with the high level is inputted, and the first rupture address signal RA<0> with the low level is inputted, the first rupture address comparing section 510 determines that the fuse rupture operation of the first fuse rupture circuit 410 was not properly performed, and outputs the first verification signal HIT0 with the low level.

In the case where a bit failure did not occur, when both the first failure address signal FA<0> and the first rupture address signal RA<0> are inputted at the low levels, the first rupture address comparing section 510 outputs the first verification signal HIT0 of the low level, since it is not necessary to perform the fuse rupture operation.

Furthermore, if the second failure address signal FA<1> with the high level is inputted to the rupture signal generation unit 300, indicating that a bit failure occurred, the rupture signal generation unit 300 generates the second rupture signal RUPON2 with the high level. The second fuse rupture circuit 420 receives the second rupture signal RUPON2 with the high level and performs the fuse rupture operation. When the second fuse rupture circuit 420 is properly performed the fuse rupture operation, the second fuse rupture circuit 420 outputs the second rupture address signal RA<1> with the high level, and when the second fuse rupture circuit 420 does not properly perform the fuse rupture operation, the second fuse rupture circuit 420 outputs the second rupture address signal RA<1> with the low level.

If the second failure address signal FA<1> with the low level is inputted to the rupture signal generation unit 300, indicating that a bit failure did not occur, the rupture signal generation unit 300 generates the second rupture signal RUPON2 with the low level. The second fuse rupture circuit 420 receives the second rupture signal RUPON2 with the low level, and does not perform the fuse rupture operation, and outputs the second rupture address signal RA<1> with the low level.

In the case where a bit failure occurred, when both the second failure address signal FA<1> and the second rupture address signal RA<1> are inputted at the high levels, the second rupture address comparing section 520 outputs the second verification signal HIT1 with the high level, since the fuse rupture operation of the second fuse rupture circuit 420 was properly performed. However, when the second failure address signal FA<1> with the high level is inputted, and the second rupture address signal RA<1> with the low level is inputted, the second rupture address comparing section 520 determines that the fuse rupture operation of the second fuse rupture circuit 420 was not properly performed, and outputs the second verification signal HIT1 with the low level.

Where a bit failure did not occur, when both the second failure address signal FA<1> and the second rupture address signal RA<1> are inputted at the low levels, the second rupture address comparing section 520 outputs the second verification signal HIT1 of the low level, since it is not necessary to perform the fuse rupture operation.

In the event that the third failure address signal FA<2> with the high level is inputted to the rupture signal generation unit 300, indicating that a bit failure occurred, the rupture signal generation unit 300 generates the third rupture signal RUPON3 with the high level. The third fuse rupture circuit 430 receives the third rupture signal RUPON3 with the high level and performs the fuse rupture operation. When the third fuse rupture circuit 430 properly performs the fuse rupture operation, the third fuse rupture circuit 430 outputs the third rupture address signal RA<2> with the high level, and when the third fuse rupture circuit 430 does not properly perform the fuse rupture operation, the third fuse rupture circuit 430 outputs the third rupture address signal RA<2> with the low level.

Also, if the third failure address signal FA<2> with the low level is inputted to the rupture signal generation unit 300, indicating that a bit failure did not occur, the rupture signal generation unit 300 generates the third rupture signal RUPON3 with the low level. The third fuse rupture circuit 430 receives the third rupture signal RUPON3 with the low level and does not perform the fuse rupture operation, and outputs the third rupture address signal RA<2> with the low level.

In the case where a bit failure occurred, when both the third failure address signal FA<2> and the third rupture address signal RA<2> are inputted at the high levels, the third rupture address comparing section 530 outputs the third verification signal HIT2 with the high level, since the fuse rupture operation of the third fuse rupture circuit 430 was properly performed. However, when the third failure address signal FA<2> with the high level is inputted, and the third rupture address signal RA<2> with the low level is inputted, the third rupture address comparing section 530 determines that the fuse rupture operation of the third fuse rupture circuit 430 was not properly performed, and outputs the third verification signal HIT2 with the low level.

In the case where a bit failure did not occur, when both the third failure address signal FA<2> and the third rupture address signal RA<2> are inputted at the low levels, the third rupture address comparing section 530 outputs the third verification signal HIT2 of the low level, since it is not necessary to perform the fuse rupture operation.

If the fourth failure address signal FA<3> with the high level is inputted to the rupture signal generation unit 300, indicating that a bit failure occurred, the rupture signal generation unit 300 generates the fourth rupture signal RUPON4 with the high level. The fourth fuse rupture circuit 440 receives the fourth rupture signal RUPON4 with the high level and performs the fuse rupture operation. When the fourth fuse rupture circuit 440 properly performs the fuse rupture operation, the fourth fuse rupture circuit 440 outputs the fourth rupture address signal RA<3> with the high level, and when the fourth fuse rupture circuit 440 does not properly perform the fuse rupture operation, the fourth fuse rupture circuit 440 outputs the fourth rupture address signal RA<3> with the low level.

In the event that the fourth failure address signal FA<3> with the low level is inputted to the rupture signal generation unit 300, indicating that a bit failure did not occur, the rupture signal generation unit 300 generates the fourth rupture signal RUPON4 with the low level. The fourth fuse rupture circuit 440 receives the fourth rupture signal RUPON4 with the low level, and does not perform the fuse rupture operation, and outputs the fourth rupture address signal RA<3> with the low level.

In the case where a bit failure occurred, when both the fourth failure address signal FA<3> and the fourth rupture address signal RA<3> are inputted at the high levels, the fourth rupture address comparing section 540 outputs the fourth verification signal HIT3 with the high level, since the fuse rupture operation of the fourth fuse rupture circuit 440 was properly performed. However, when the fourth failure address signal FA<3> with the high level is inputted, and the fourth rupture address signal RA<3> with the low level is inputted, the fourth rupture address comparing section 540 determines that the fuse rupture operation of the fourth fuse rupture is circuit 440 was not properly performed, and outputs the fourth verification signal HIT3 with the low level.

In the case where a bit failure did not occur, when both the fourth failure address signal FA<3> and the fourth rupture address signal RA<3> are inputted at the low levels, the fourth rupture address comparing section 540 outputs the fourth verification signal HIT3 of the low level, since it is not necessary to perform the fuse rupture operation.

That is to say, when the logic levels of the plurality of failure address signals FA<0:3> and the plurality of rupture address signals RA<0:3> are all at the same logic level, the rupture verification unit 500 determines that the fuse rupture operation was performed in accordance with the failure address signals FA<0:3>, and outputs the plurality of verification signals HIT0:3 with the high levels.

The reset signal generation unit 600 receives the plurality of verification signals HIT0:3 and generates the reset signal RST, as depicted in FIGS. 1 and 4. The reset signal generation unit 600 may comprise a logic gate that performs an AND operation. The reset signal generation unit 600 enables the reset signal RST when all of the plurality of verification signals HIT0:3 are enabled.

In the case where the fuse rupture operation was performed in accordance with the failure address signals, all of the plurality of verification signals HIT0:3 are in the enabled states. At this time, since it is not necessary to perform the fuse rupture operation any more, the reset signal generation unit 600 enables the reset signal RST. When the reset signal RST is enabled, the driving unit 100 cuts of the output of the oscillation signal OSC so that the fuse rupture operation is ended. Further, in an embodiment of the electrical fuse rupture circuit in accordance with the present invention, in the case where the fuse rupture operation was not performed in accordance with the failure address signals, any one of the plurality of verification signals HIT0:3 is in the disabled state. At this time, the reset signal generation unit 600 disables the reset signal RST. The driving unit 100 receives the reset signal RST in the disabled state and outputs the oscillation signal OSC so that the fuse rupture operation is performed again. The reset signal generation unit 600 outputs the reset signal RST with the high level when all of the plurality of verification signals HIT0:3 are inputted at the high levels.

In the case where the fuse rupture operation was performed in accordance with the failure address signals, all of the plurality of verification signals HIT0:3 have the high levels. At this time, since it is not necessary to perform the fuse rupture operation any more, the reset signal generation unit 600 outputs the reset signal RST with the high level. When the reset signal RST with the high level is inputted, the driving unit 100 cuts off the output of the oscillation signal OSC so that the fuse rupture operation is ended. In the event that the fuse rupture operation was not performed in accordance with the failure address signals, any one of the plurality of verification signals HIT0:3 has the low level. At this time, the reset signal generation unit 600 outputs the reset signal RST with the low level. When the reset signal RST with the low level is inputted, the driving unit 100 outputs the oscillation signal OSC so that the fuse rupture operation is performed again.

Figure 5:
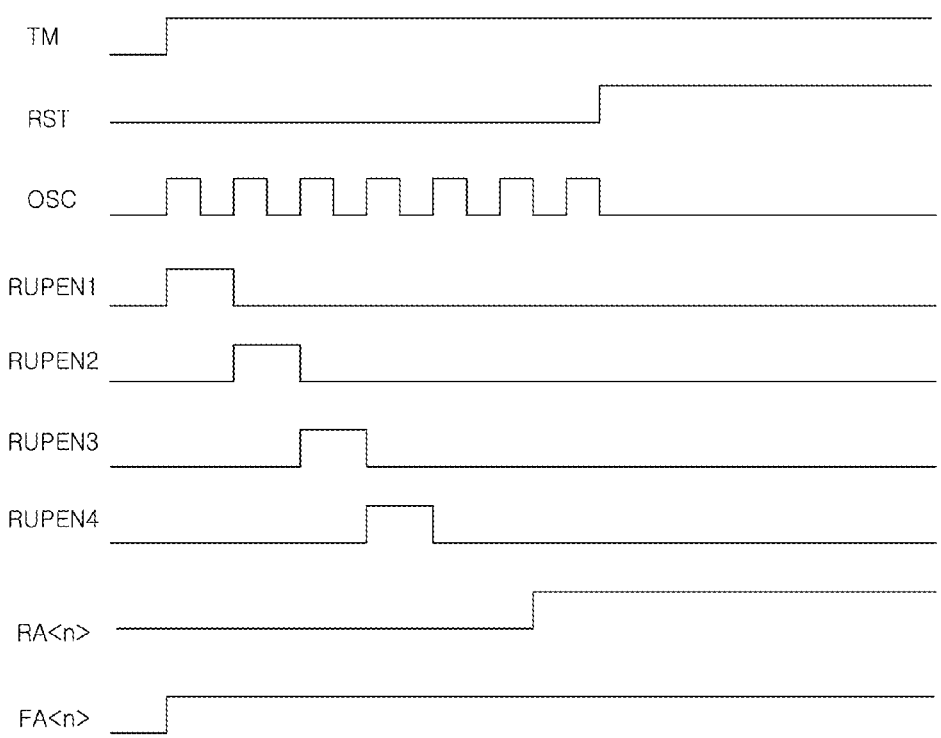
FIG. 5 is a timing diagram illustrating electrical fuse rupture circuit operation in accordance with an embodiment of the present invention.

Referring now to FIG. 5, when the test mode signal TM transitions to the high level and the reset signal RST has the low level, the driving unit 100 outputs the oscillation signal OSC with the predetermined cycle.

The rupture enable signal generation unit 200 receives the oscillation signal OSC and sequentially outputs the plurality of rupture enable signals RUPEN1:4 as pulses having high logic levels. The rupture signal generation unit 300 compares the plurality of rupture enable signals RUPEN1:4 with the high levels with a failure address signal FA<n> (n is one of integers 0 to 3) among the plurality of failure address signals FA<0:3>, which has transitioned to the high level as a bit failure occurred, and generates a rupture signal. The rupture unit 400 performs the fuse rupture operation for the memory cell in which the bit failure occurred, in response to the rupture signal, and generates a rupture address signal RA<n> (n is one of integers 0 to 3), among the plurality of rupture address signals RA<0:3>, for which the fuse rupture operation has been completed, at the high level. The rupture verification unit 600 compares the failure address signal FA<n> (n is one of integers 0 to 3), which has transitioned to the high level as the bit failure occurred, with the rupture address signal RA<n> (n is one of integers 0 to 3) for which the fuse rupture operation has been completed, and verifies whether the fuse rupture is operation was properly performed. The reset signal generation unit 600 transitions the reset signal RST to the high level when the fuse rupture operation is ended.

While certain embodiments have been described above, it will be understood to those skilled in the art that the embodiments described are by way of example only. Accordingly, the electrical fuse rupture circuit described herein should not be limited based on the described embodiments. Rather, the electrical fuse rupture circuit described herein should only be limited in light of the claims that follow, when taken in conjunction with the above description and accompanying drawings.

What is claimed is:

1. An electrical fuse rupture circuit comprising:
   a fuse rupture control block configured to receive failure address signals of each memory cell, perform a fuse rupture operation in response to a test mode signal and a reset signal, and output rupture address signals for each memory cell for which fuse rupture operation is properly performed; and
   a rupture verification determination block configured to compare the failure address signals of each memory cell and the rupture address signals of each memory cell, determine whether the fuse rupture operation is properly performed, and generate a reset signal having a logic level that is changed when the fuse rupture operation has succeeded, and is unchanged when the fuse rupture is operation has failed.

2. The electrical fuse rupture circuit according to claim 1, wherein the fuse rupture control block receives as an input the reset signal having a logic level that is changed according to whether the fuse rupture operation has succeeded, and ends the fuse rupture operation when the fuse rupture operation has succeeded, and continues the fuse rupture operation when the fuse rupture operation has failed.

3. The electrical fuse rupture circuit according to claim 1, wherein the fuse rupture control block ends the fuse rupture operation when the logic level of the reset signal is changed, and continues the fuse rupture operation when the logic level of the reset signal is unchanged.

4. The electrical fuse rupture circuit according to claim 1, wherein the rupture verification determination block compares the failure address signals and the rupture address signals, changes the logic level of the reset signal when logic levels of two signals correspond to each other, and retains the logic level of the reset signal when logic levels of two signals do not correspond to each other.

5. An electrical fuse rupture circuit comprising:
   is a driving unit configured to generate an oscillation signal for performing a fuse rupture operation, in response to a test mode signal and a reset signal;
   a fuse rupture block configured to receive a plurality of failure address signals, perform the fuse rupture operation in response to the oscillation signal, and output a plurality of rupture address signals for verifying the fuse rupture operation for each memory cell; and
   a rupture verification determination block configured to execute a logic operation for each of the plurality of failure address signals and each of the plurality of rupture address signals, and determine whether to enable the reset signal, according to an operation result.

6. The electrical fuse rupture circuit according to claim 5, wherein the driving unit comprises:
   a control section configured to generate a control signal in response to the test mode signal and the reset signal;
   an oscillator configured to output the oscillation signal; and
   a switch section connected with the oscillator and configured to determine whether to operate the oscillator in response to the control signal.

7. The electrical fuse rupture circuit according to claim 6, wherein the driving unit outputs the oscillation signal when the test mode signal is enabled and the reset signal is disabled, and cuts off output of the oscillation signal when the reset signal is enabled.

8. The electrical fuse rupture circuit according to claim 5, wherein the fuse rupture block comprises:
   a rupture enable signal generation unit configured to generate a plurality of rupture enable signals, with a predetermined pulse width, in response to the oscillation signal;
   a rupture signal generation unit configured to compare the plurality of rupture enable signals and the plurality of failure address signals, and generate a plurality of rupture signals which are enabled when a bit failure occurs in each memory cell; and
   a rupture unit configured to generate the plurality of rupture address signals, which are enabled when the fuse rupture operation is performed in response to the plurality of rupture signals.

9. The electrical fuse rupture circuit according to claim 8, wherein the rupture enable signal generation unit comprises:
   a plurality of flip-flops configured to receive the oscillation signal and generate the plurality of rupture enable signals.

10. The electrical fuse rupture circuit according to claim 8, wherein the rupture signal generation unit comprises:
- a plurality of failure address comparing sections configured to compare the plurality of rupture enable signals and the plurality of failure address signals, and generate the plurality of rupture signals which are enabled when the bit failure occurs in each memory cell.

11. The electrical fuse rupture circuit according to claim 10, wherein the address comparing sections perform an AND operation for the plurality of rupture enable signals and the plurality of failure address signals.

12. The electrical fuse rupture circuit according to claim 8, wherein the rupture unit comprises:
- a plurality of fuse rupture circuits configured to apply an electrical stress to fuses in response to the plurality of rupture signals, and perform the fuse rupture operation.

13. The electrical fuse rupture circuit according to claim 5, wherein the rupture verification determination block comprises:
- a rupture verification unit configured to compare the plurality of failure address signals and the plurality of rupture address signals, and generate a plurality of verification signals that indicate whether to perform the fuse rupture operation; and
- a reset signal generation unit configured to output the reset signal in an enabled state when all of a plurality of verification signals are enabled, and output the reset signal in a disabled state when any one of the plurality of verification signals is disabled.

14. The electrical fuse rupture circuit according to claim 13, wherein the rupture verification unit comprises:
- is a plurality of rupture address comparing sections configured to compare the plurality of failure address signals and the plurality of rupture address signals, and generate the plurality of verification signals.

15. The electrical fuse rupture circuit according to claim 13, wherein the rupture address comparing sections enable the plurality of verification signals when all of the plurality of failure address signals and the plurality of rupture address signals are in enabled states or in disabled states.

* * * * *